(12) United States Patent
Budd et al.

(10) Patent No.: US 9,372,307 B1
(45) Date of Patent: Jun. 21, 2016

(54) MONOLITHICALLY INTEGRATED III-V OPTOELECTRONICS WITH SI CMOS

(71) Applicant: International Business Machines Corporation, Armonk, NY (US)

(72) Inventors: Russell A. Budd, North Salem, NY (US); Effendi Leobandung, Stormville, NY (US); Ning Li, White Plains, NY (US); Jean-Olivier Plouchart, New York, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/672,261

(22) Filed: Mar. 30, 2015

(51) Int. Cl.
| | |
|---|---|
| *G02B 6/12* | (2006.01) |
| *H01L 21/00* | (2006.01) |
| *G02B 6/10* | (2006.01) |
| *G02B 6/122* | (2006.01) |
| *H01L 31/173* | (2006.01) |
| *G02B 6/13* | (2006.01) |
| *H01S 5/026* | (2006.01) |
| *H01L 33/00* | (2010.01) |

(52) U.S. Cl.
CPC ............ *G02B 6/122* (2013.01); *G02B 6/12004* (2013.01); *G02B 6/13* (2013.01); *H01L 31/173* (2013.01); *H01L 33/0062* (2013.01); *H01S 5/026* (2013.01); *G02B 2006/12061* (2013.01); *G02B 2006/12121* (2013.01); *G02B 2006/12123* (2013.01); *G02B 2006/12142* (2013.01)

(58) Field of Classification Search
CPC ............ G02B 6/12; G02B 6/122; G02B 6/13; G02B 6/136; G02B 6/42; G02B 6/43; G02B 6/12004; H01L 31/173; H01L 33/0062; H01L 31/0352; H01S 5/026
USPC .................. 385/14, 129–132; 438/22, 31, 69; 257/E31.032

See application file for complete search history.

(56) References Cited

U.S. PATENT DOCUMENTS

| | | | |
|---|---|---|---|
| 4,956,682 | A | 9/1990 | Ohnaka et al. |
| 5,692,002 | A | 11/1997 | Mizutani |

(Continued)

FOREIGN PATENT DOCUMENTS

| | | |
|---|---|---|
| CN | 101937873 A | 1/2011 |
| CN | 101937873 B | 7/2012 |

(Continued)

OTHER PUBLICATIONS

Pending U.S. Appl. No. 14/048,131, entitled: "Lateral BICMOS Replacement Metal Gate", filed Oct. 8, 2013.

(Continued)

*Primary Examiner* — Akm Enayet Ullah
*Assistant Examiner* — Michael Mooney
(74) *Attorney, Agent, or Firm* — Andrew G. Wakim; Louis Percello (57) ABSTRACT

A method of forming monolithically integrated III-V optoelectronics with a silicon complementary metal-oxide-semiconductor (CMOS) device. The method may include; forming a buried waveguide in a buried oxide (BOX) layer of a semiconductor-on-insulator (SOI) substrate; forming a first optoelectronic device and a second optoelectronic device adjacent to the buried waveguide; and forming a CMOS device on a semiconductor layer above the BOX layer.

20 Claims, 8 Drawing Sheets

(56) References Cited

U.S. PATENT DOCUMENTS

| | | |
|---|---|---|
| 6,477,285 B1 | 11/2002 | Shanley |
| 6,828,598 B1 | 12/2004 | Coffa et al. |
| 6,870,977 B2 | 3/2005 | Devaux et al. |
| 6,991,892 B2 | 1/2006 | Block |
| 7,218,826 B1 | 5/2007 | Gunn, III et al. |
| 7,251,408 B1 | 7/2007 | Gunn, III et al. |
| 7,372,121 B2 | 5/2008 | Zhong et al. |
| 7,563,630 B2 | 7/2009 | Honkawa et al. |
| 8,062,919 B2 | 11/2011 | Apsel et al. |
| 8,313,962 B2 | 11/2012 | Lott et al. |
| 8,508,008 B2 | 8/2013 | Griebenow et al. |
| 8,741,684 B2 * | 6/2014 | Bogaerts et al. ... G02B 6/12004 257/E31.032 |
| 2002/0110309 A1 | 8/2002 | Devaux et al. |
| 2008/0049802 A1 | 2/2008 | Kim et al. |
| 2010/0127236 A1 | 5/2010 | Bour et al. |
| 2013/0210214 A1 | 8/2013 | Dallesasse et al. |

FOREIGN PATENT DOCUMENTS

| | | |
|---|---|---|
| JP | 1150356 A | 6/1989 |
| JP | 1150356 U | 10/1989 |
| JP | 2004055611 A | 2/2004 |
| JP | 20100245559 A | 10/2010 |

OTHER PUBLICATIONS

Pending U.S. Appl. No. 14/477,328, entitled: "Intra Chip Optical Interconnect Structure", filed Sep. 4, 2014.

Pending U.S. Appl. No. 14/518,142, entitled: "Variable Buried Oxide Thickness for a Waveguide", filed Oct. 20, 2014.

Pending U.S. Appl. No. 14/661,037, entitled: "Optoelectronics and CMOS Integration on GOI Substrate", filed Mar. 18, 2015.

Zhao et al., "Polymer waveguides useful over a very wide wavelength range from the ultraviolet to infrared", Applied Physics Letters, vol. 77, No. 19, Nov. 6, 2000, 4 pages.

Oxford Instruments, "SiN/ SiO Distributed Bragg Reflectors by PECVD", Plasmalab Data, Mar. 2007, www.oxfordplasma.de/process/sionbragg.htm, 1 page.

* cited by examiner

MONOLITHICALLY INTEGRATED III-V OPTOELECTRONICS WITH SI CMOS

BACKGROUND

The present invention generally relates to semiconductor device manufacturing, and more particularly to the formation of buried optoelectronic devices, such as lasers, modulators, photo-detectors, etc, and an optical interconnect in a buried oxide (BOX) layer, such that the optoelectronic device is below a complementary metal-oxide-semiconductor (CMOGaNS) device circuit layer.

As micro-electronic systems continue to scale down, the resultant electrical interconnect density would have to accommodate increased power dissipation, signal delay and cross-talk, while running at extremely high clock speeds. Current trends indicate that in less than a decade the power consumed by interconnects might become the limiting factor in determining the switching speeds in integrated circuits. To overcome these problems the integration of optical interconnects and systems alongside conventional Silicon (Si) based micro-electronic circuits would be a major step forward. Light based intra and inter-chip communication would diminish latency considerably and reduce power consumption by eliminating capacitive interconnect loss. Improved optoelectronic integration can also help increase the speed of transceiver circuits used in optical communication systems, thereby increasing the overall bandwidth.

SUMMARY

According to one embodiment of the present invention, a method is provided. The method may include forming a buried waveguide in a semiconductor-on-insulator (SOI) substrate, the SOI substrate has a first device region, a first optoelectronic region, a second device region, and a second optoelectronic region, the SOI substrate includes a semiconductor layer on a buried oxide (BOX) layer, the BOX layer is on a substrate, wherein the buried waveguide is in the BOX layer and the buried waveguide is in the second device region; forming a device on the semiconductor layer in the first device region and in the second device region; removing the BOX layer and the semiconductor layer from the first optoelectronic region and the second optoelectronic region; forming a first insulator layer on the device, on the semiconductor layer, on the substrate, and on sidewalls of the BOX layer and buried waveguide; forming a first optoelectronic device on the substrate in the first optoelectronic region and a second optoelectronic device on the substrate in the second optoelectronic region, the first optoelectronic device includes a top cladding layer, an active region, and a bottom cladding layer, wherein the top cladding layer is on the active region, the active region is on the bottom cladding layer, the bottom cladding layer is on a buffer layer, and the buffer layer is on the substrate; forming a first bottom contact on a top surface of the bottom cladding layer, a first top contact on a top surface of the top cladding layer, a second bottom contact on a bottom portion of the second optoelectronic device, and a second top contact on a top portion of the second optoelectronic device; forming a second insulator layer on the first insulator layer, on the first bottom contact, on the first top contact, on the second bottom contact, and on the second top contact; and forming a device interconnect, a first bottom interconnect, a first top interconnect, a second bottom interconnect, and a second top interconnect through the second insulator layer, wherein the device interconnect is in electrical connection with the device, the first bottom interconnect is in electrical connection with the first bottom contact, the first top interconnect is in electrical connection with the first top contact, the second bottom interconnect is in electrical connection with the second bottom contact, and the second top interconnect is in electrical connection with the second top contact.

According to another embodiment of the present invention, a method is provided. The method may include forming a buried waveguide in a buried oxide (BOX) layer, the BOX layer is in a first device region, a first optoelectronic region, a second device region and a second optoelectronic region, the buried waveguide is in the second device region, and the BOX layer is on a substrate; removing the BOX layer from the first optoelectronic region and the second optoelectronic region, a top surface of the substrate is exposed in the first optoelectronic region and in the second optoelectronic region; forming a first optoelectronic device on the exposed top surface of the substrate in the first optoelectronic region and a second optoelectronic device on the exposed top surface of the substrate in the second optoelectronic region, the first optoelectronic device includes a top cladding layer, an active region, and a bottom cladding layer, wherein the top cladding layer is on the active region, the active region is on the bottom cladding layer, the bottom cladding layer is on a buffer layer, and the buffer layer is on the substrate; forming a first insulator layer on the BOX layer, on the first optoelectronic device, and on the second optoelectronic device; forming a semiconductor layer on the first insulator layer; forming a device on the semiconductor layer in the first device region and in the second device region; forming a first bottom contact on a top surface of the bottom cladding layer, a first top contact on a top surface of the top cladding layer, a second bottom contact on a bottom portion of the second optoelectronic device, and a second top contact on a top portion of the second optoelectronic device; forming a second insulator layer on the device, on the semiconductor layer, on the first bottom contact, on the first top contact, on the second bottom contact, and on the second top contact; and forming a device interconnect, a first bottom interconnect, a first top interconnect, a second bottom interconnect, and a second top interconnect through the second insulator layer, wherein the device interconnect is in electrical connection with the device, the first bottom interconnect is in electrical connection with the first bottom contact, the first top interconnect is in electrical connection with the first top contact, the second bottom interconnect is in electrical connection with the second bottom contact, and the second top interconnect is in electrical connection with the second top contact.

According to another embodiment of the present invention, a structure is provided. The structure may include a buried waveguide in a buried oxide (BOX) layer, the BOX layer is on a substrate in a first device region and in a second device region, the substrate is in the first device region, a first optoelectronic region, the second device region, and a second optoelectronic region; a semiconductor layer above the BOX layer in the first device region and in the second device region; a first optoelectronic device on the substrate in the first optoelectronic region and a second optoelectronic device on the substrate in the second optoelectronic region, the first optoelectronic device includes a top cladding layer, an active region, and a bottom cladding layer, wherein the top cladding layer is on the active region, the active region is on the bottom cladding layer, the bottom cladding layer is on a buffer layer, and the buffer layer is on the substrate; a device on the semiconductor layer in the first device region and in the second device region; a first bottom contact on a top surface of the bottom cladding layer, a first top contact on a top surface of the top cladding layer, a second bottom contact on a bottom portion of the second optoelectronic device, and a second top contact on a top portion of the second optoelectronic device; a second insulator layer above the device, above the first optoelectronic device, and above the second optoelectronic device; a device interconnect in electrical connection with the device, a first bottom interconnect in electrical connection with the first bottom contact, a first top interconnect in electrical connection with the first top contact, a second bottom interconnect in electrical connection with the second bottom contact, and a second top interconnect in electrical connection with the second top contact.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation of buried optoelectronic devices, such as lasers, modulators, photo-detectors, etc, and an optical interconnect in a buried oxide (BOX) layer, such that the optoelectronic device is below a complementary metal-oxide-semiconductor (CMOS) device circuit layer. Ideally, it may be desirable to form an optoelectronic device and an optical interconnect with the least amount of fabrication variables that may affect the coupling between the optoelectronic device and optical interconnect. One way to fabricate an optoelectronic device and optical interconnect with the least amount of variables is to form the optoelectronic device on a base substrate in a buried oxide (BOX) layer. One embodiment by which to form a buried optoelectronic device and optical interconnect is described in detail below referring to the accompanying drawings FIGS. 1-15.

Figure 1:
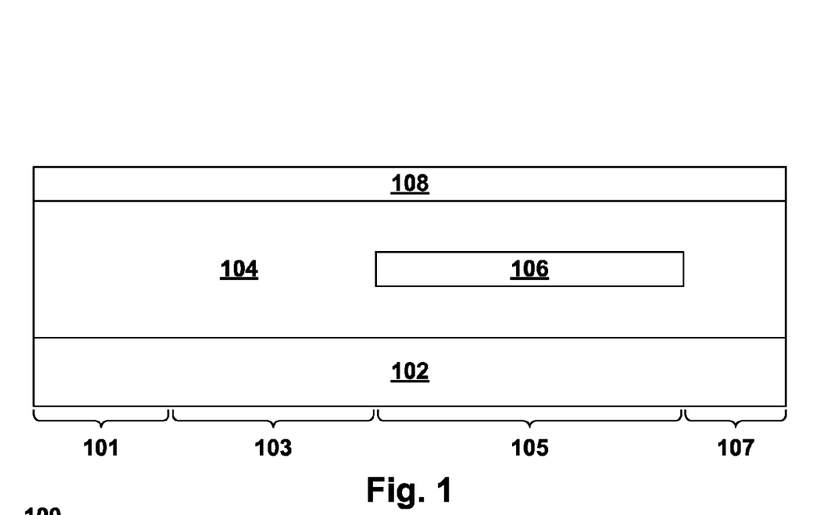
FIG. 1 is a cross section view of a semiconductor structure, according to an exemplary embodiment.

With reference to FIG. 1, a demonstrative illustration of structure 100 is provided during an intermediate step of a method of fabricating a buried optoelectronic device and optical interconnect, according to an embodiment. More specifically, the method can start by providing a semiconductor-on-insulator (SOI) substrate with a buried waveguide 106.

The SOI substrate may include (from bottom to top) a substrate 102, a BOX layer 104, and a semiconductor layer 108. The SOI substrate may have a first device region 101, a first optoelectronic region 103, a second device region 105, and a second optoelectronic region 107. The buried waveguide 106 may be in the second device region 105 and formed in the BOX layer 104. The SOI substrate may be formed using any SOI substrate formation technique known in the art, such as, for example, Separation by Ion Implantation of Oxygen (SIMOX) or layer transfer. If a layer transfer process is employed, an optional thinning step may follow the bonding of two semiconductor wafers together. The optional thinning step can reduce the thickness of a layer to a desirable thickness.

The substrate 102 may include, for example, a bulk semiconductor. The substrate 102 may include any semiconductor material known in the art, such as, for example; Si, Ge, SiGe, SiC, SiGeC, Ga, GaAs, InAs, InP, or other elemental or compound semiconductors. The substrate 102 may include, for example; an n-type, p-type, or undoped semiconductor material and may have a monocrystalline, polycrystalline, or amorphous structure. The substrate 102 may have any crystallographic orientation, such as, for example, (100) or (111). In an embodiment, the substrate 102 is a bulk silicon substrate having a (100) crystallographic orientation. It should be noted, the substrate 102 may be referred to as the base substrate for subsequent optoelectronic device formation.

The BOX layer 104 may be formed on the substrate 102 using any deposition techniques known in the art, such as, for example; ion implantation, thermal or plasma oxidation or nitridation, chemical vapor deposition, and/or physical vapor deposition. The BOX layer 104 may be any dielectric material known in the art, such as, for example; oxides, nitrides, or oxynitrides. The BOX layer 104 may have a thickness ranging from about 1 nm to about 10 nm, but other thicknesses may be used. In an embodiment, the BOX layer 104 is $SiO_2$ having a thickness of about 2 nm. In an alternative embodiment, the BOX layer 104 may include multiple dielectric layers or a stack of dielectric layers including a silicon oxide layer and/or a silicon nitride layer.

The buried waveguide 106 may be formed in the BOX layer 104 during the formation of the BOX layer 104 or after the formation of the BOX layer 104. If the buried waveguide 106 is formed after the BOX layer 104 an additional etch and deposition process may be needed, such as, for example, by etching a trench in the BOX layer 104, forming the buried waveguide 106 in the trench, and reforming the BOX layer 104 above the buried waveguide 106. The trench may be formed in the BOX layer 104 using any etching technique known in the art, such as, for example, a reactive ion etching process. The buried waveguide 106 may be deposited in the trench using any deposition technique known in the art, such as, for example, chemical vapor deposition, plasma enhanced chemical vapor deposition, atomic layer deposition, or physical vapor deposition. The buried waveguide 106 may be any waveguide material known in the art, such as, for example, nitrides, oxides, or oxynitrides. In an embodiment, the buried waveguide 106 is SiN.

The semiconductor layer 108 may be formed on the BOX layer 104 using any deposition technique known in the art, such as, for example, chemical vapor deposition, plasma enhanced chemical vapor deposition, atomic layer deposition, or physical vapor deposition. The semiconductor layer 108 may be any semiconductor material known in the art, such as, for example, Si, Ge, SiGe, SiC, SiGeC, InAs, GaAs, InP or other semiconductors. The semiconductor layer 108 may have any crystallographic orientation, such as, for example, (100) or (111). The crystallographic orientation may depend on the orientation of the substrate 102. In an embodiment, the semiconductor layer 108 is silicon having a (100) crystallographic orientation.

Figure 2:
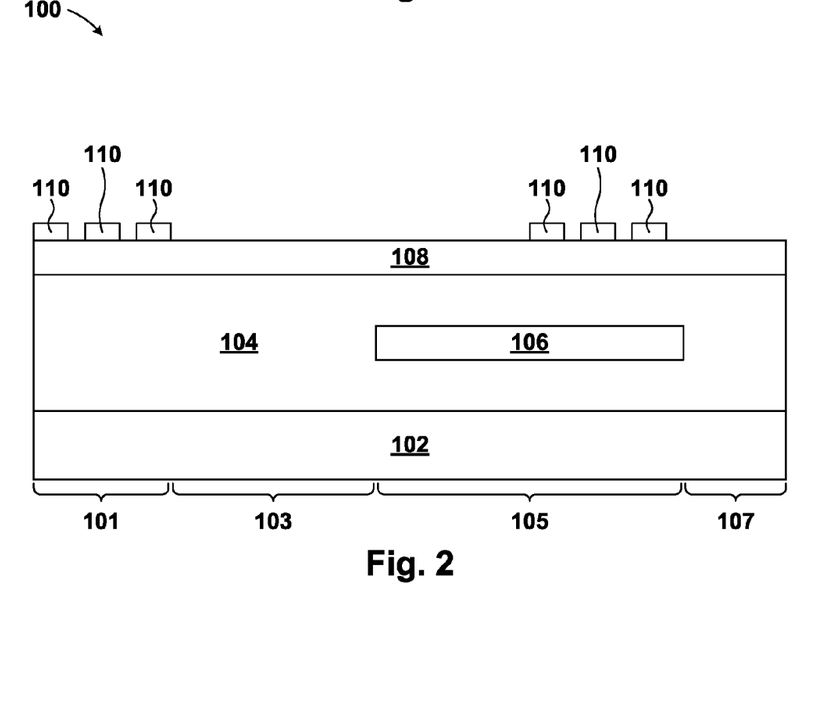
FIG. 2 is a cross section view of the semiconductor structure and illustrates the formation a device in a first device region and in a second device region, according to an exemplary embodiment.

With reference to FIG. 2, a demonstrative illustration of structure 100 is provided during an intermediate step of the method of fabricating a buried optoelectronic device and optical interconnect, according to an embodiment. More specifically, the method may include forming devices 110 on the semiconductor layer 108 in the first and second device regions 101, 105.

The devices 112 may be formed on the semiconductor layer 108 using any device formation technique known in the art, such as, for example, a deposition, masking, and etching process with a maximum temperature of about 1000° C. The devices 112 may be any electrical device known in the art, such as, for example, a Si CMOS device, SiGe or III-V channel MOSFETs, bipolar junction transistors, or any other devices used in the art. In an embodiment, the devices 112 are a Si CMOS device. The devices 112 may be used to send signals to a laser, a modulator, or a detector, as is known in the art. In the illustrated embodiment, two sets of three devices 112 are formed on the semiconductor layer 108; however, other device configurations may be used. It should be noted, the devices 112 may be at a device level that is above a buried waveguide level.

Figure 3:
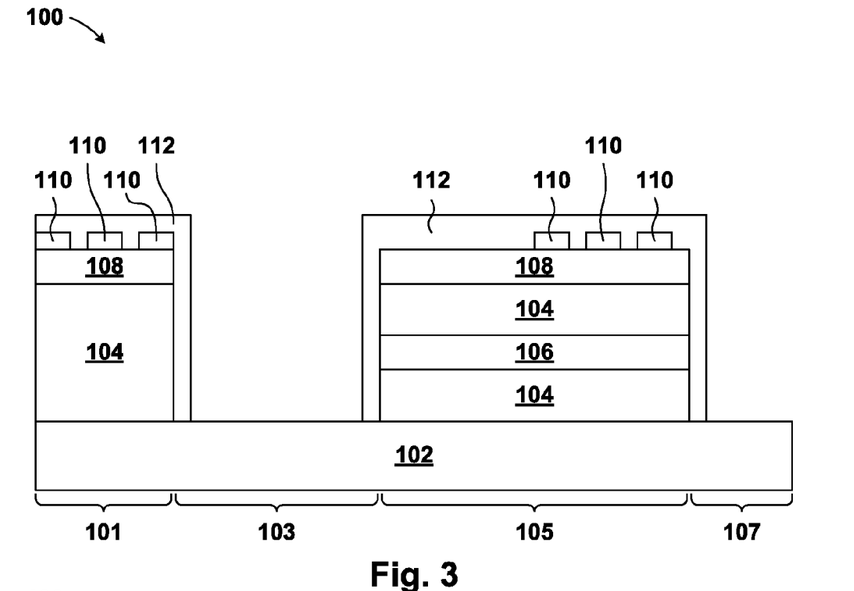
FIG. 3 is a cross section view of the semiconductor structure and illustrates the formation a first insulator layer in the first device region and the second device region, according to an exemplary embodiment.

With reference to FIG. 3, a demonstrative illustration of structure 100 is provided during an intermediate step of the method of fabricating a buried optoelectronic device and optical interconnect, according to an embodiment. More specifically, the method may include etching a trench in the first and second optoelectronic regions 103, 105 and forming a first insulator layer 112 on the devices 112, on the semiconductor layer 108, on the BOX layer 104, and on the buried waveguide 106 in the first and second device regions 101, 105.

The trench may be etched in the first and second optoelectronic regions 103, 105 using any etching technique known in the art, such as, for example, a reactive ion etching process. The trench may expose a top surface of the substrate 102 in the first and second optoelectronic regions 103, 107.

The first insulator layer 112 may be formed on the devices 112, on the semiconductor layer 108, on the BOX layer 104, on the buried waveguide 106, and on the substrate 102 using any deposition technique known in the art, such as, for example, chemical vapor deposition, plasma enhanced chemical vapor deposition, atomic layer deposition, or physical vapor deposition. The first insulator layer 112 may be any dielectric material known in the art, such as, for example; oxides, nitrides, or oxynitrides. In an embodiment, the first insulator layer 112 may be $SiO_2$. The first insulator layer 112 may be removed from the exposed top surface of the substrate 102 using any etching technique known in the art, such as, for example, an anisotropic etching process. The first insulator layer 112 may remain on the devices 110 and semiconductor layer 108, while also covering sidewalls of the BOX layer 104 and buried waveguide 106.

Figure 4:
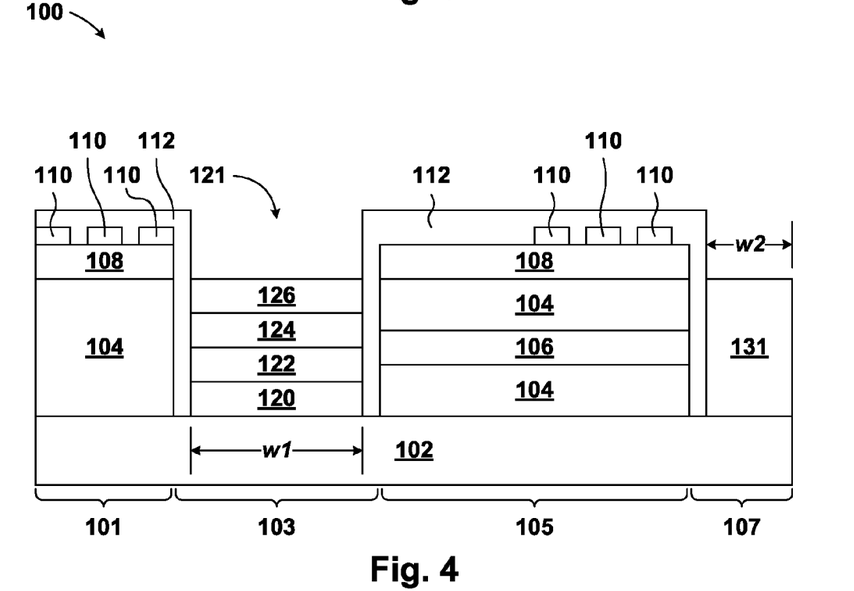
FIG. 4 is a cross section view of the semiconductor structure and illustrates the formation a first optoelectronic device in a first optoelectronic region and a second optoelectronic device in a second optoelectronic region, according to an exemplary embodiment.

With reference to FIG. 4, a demonstrative illustration of structure 100 is provided during an intermediate step of the method of fabricating a buried optoelectronic device and optical interconnect, according to an embodiment. More specifically, the method may include forming a first optoelectronic device 121 in the first optoelectronic region 103 and a second optoelectronic device 131 in the second optoelectronic region 107.

In an embodiment, the first optoelectronic device 121 is a laser formed at a temperature of about 650° C. The first optoelectronic device 121 may include (from top to bottom) a top cladding layer 126, an active region 124, and a bottom cladding layer 122 on a buffer layer 120. The first optoelectronic device 121 may have a lattice structure that matches the substrate 102. The first optoelectronic device 121 may have a width (w1) ranging from about 100 µm to about 500 µm, but other widths may be used. In an alternative embodiment, the first optoelectronic device 121 may include a wafer bonding process into a pre-patterned trench region.

The buffer layer 120 may be formed in the trench and on the top surface of the substrate 102, using any deposition technique known in the art, such as, for example, epitaxial growth, chemical vapor deposition, plasma enhanced chemical vapor deposition, atomic layer deposition, or physical vapor deposition. The buffer layer 120 may be any semiconductor material known in the art, such as, for example, IV semiconductors and/or III-V semiconductors. The buffer layer 120 may be doped in-situ and may be p-type or n-type.

The bottom cladding layer 122 may be formed on the buffer layer 120 using any deposition technique known in the art, such as, for example, epitaxial growth, chemical vapor deposition, plasma enhanced chemical vapor deposition, atomic layer deposition, or physical vapor deposition. The bottom cladding layer 122 may be any semiconductor material known in the art, such as, for example, IV semiconductors and/or III-V semiconductors. In an embodiment, the bottom cladding layer 122 is GaP. The bottom cladding layer may have a thickness of about 1 µm to about 2 µm.

The active region 124 may be formed on the bottom cladding layer 122 using any deposition technique known in the art, such as, for example, epitaxial growth, chemical vapor deposition, plasma enhanced chemical vapor deposition, atomic layer deposition, or physical vapor deposition. The active region 124 may include any semiconductor material known in the art, such as, for example, IV semiconductors and/or III-V semiconductors. In an embodiment, the active region 124 is GaAsP or InGaP formed using epitaxial growth. In an alternative embodiment, the active region 124 is InGaP formed using epitaxial growth. The active region 124 may have the same lattice structure as the bottom cladding layer 122; however, the active region 124 may have a lower bandgap. The active region 124 may be adjacent to the buried waveguide 106, such that optical signals can flow between the first optoelectronic device 121 and the second optoelectronic device 131 through the buried waveguide 106.

The top cladding layer 126 may be formed on the active region 124 using any deposition technique known in the art, such as, for example, epitaxial growth, chemical vapor deposition, plasma enhanced chemical vapor deposition, atomic layer deposition, or physical vapor deposition. The top cladding layer 126 may include any semiconductor material known in the art, such as, for example, IV semiconductors and/or III-V semiconductors. In an embodiment, the top cladding layer 126 may be the same material as the bottom cladding layer 122 (e.g., GaP) grown using epitaxy. The top cladding layer 126 may be doped in-situ and may be p-type or n-type. In an embodiment, the top cladding layer 126 may have an opposite charge from the bottom cladding layer 122 (e.g., a p-type top cladding layer 126 and an n-type bottom cladding layer 124). The top cladding layer 126 and the bottom cladding layer 122 may be used as a barrier layer which may confine electrons in the active region 124.

In an embodiment, the second optoelectronic device 131 is a detector. The second optoelectronic device 131 may have a width (w2) ranging from about 10 µm to about 100 µm. The second optoelectronic device 131 may be formed using any deposition technique known in the art, such as, for example, epitaxial growth, chemical vapor deposition, plasma enhanced chemical vapor deposition, atomic layer deposition, or physical vapor deposition. The second optoelectronic device 131 may include any optoelectronic device material known in the art, such as, for example, silicon, germanium, and/or a III-V semiconductor.

Figure 5:
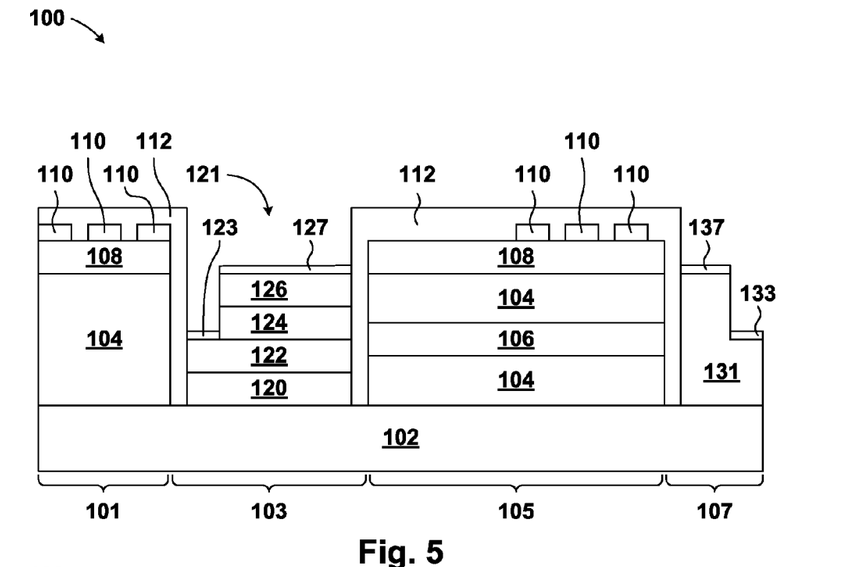
FIG. 5 is a cross section view of the semiconductor structure and illustrates the formation a first bottom contact and first top contact in the first optoelectronic region, and a second bottom contact and a second top contact in the second optoelectronic region, according to an exemplary embodiment.

With reference to FIG. 5, a demonstrative illustration of structure 100 is provided during an intermediate step of the method of fabricating a buried optoelectronic device and optical interconnect, according to an embodiment. More specifically, the method may include; forming a first bottom contact 123 on a top surface of the bottom cladding layer 122, a first top contact 127 on a top surface of the top cladding layer 126, and a second bottom and top contact 133, 137 on the second optoelectronic device 131.

The first bottom contact 123 may be formed on the top surface of the bottom cladding layer 122 by etching a trench through the top cladding layer 126 and the active region 124 using any etching technique known in the art, such as, for example, a reactive ion etching process. The trench may expose the top surface of the bottom cladding layer 122.

The first bottom contact 123 may be formed on the top surface of the bottom cladding layer 122 using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The first bottom contact 123 may be any conductive material known in the art, such as, for example, tungsten, aluminum, silver, gold, alloys thereof, or any other conductive material.

The first top contact 127 may be formed on the top surface of the top cladding layer 126 using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The first top contact 127 may be any conductive material known in the art, such as, for example, tungsten, aluminum, silver, gold, alloys thereof, or any other conductive material.

The second bottom contact 133 may be formed on a bottom portion of the second optoelectronic device 131 by etching a trench through a top portion of the second optoelectronic device 131 using any etching technique known in the art, such as, for example, a reactive ion etching process. The second bottom contact 133 may be formed on the bottom portion of the second optoelectronic device 131 using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The second bottom contact 133 may be any conductive material known in the art, such as, for example, tungsten, aluminum, silver, gold, alloys thereof, or any other conductive material.

The second top contact 137 may be formed on the top portion of the second optoelectronic device 131 using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The second top contact 137 may be any conductive material known in the art, such as, for example, tungsten, aluminum, silver, gold, alloys thereof, or any other conductive material.

Figure 6:
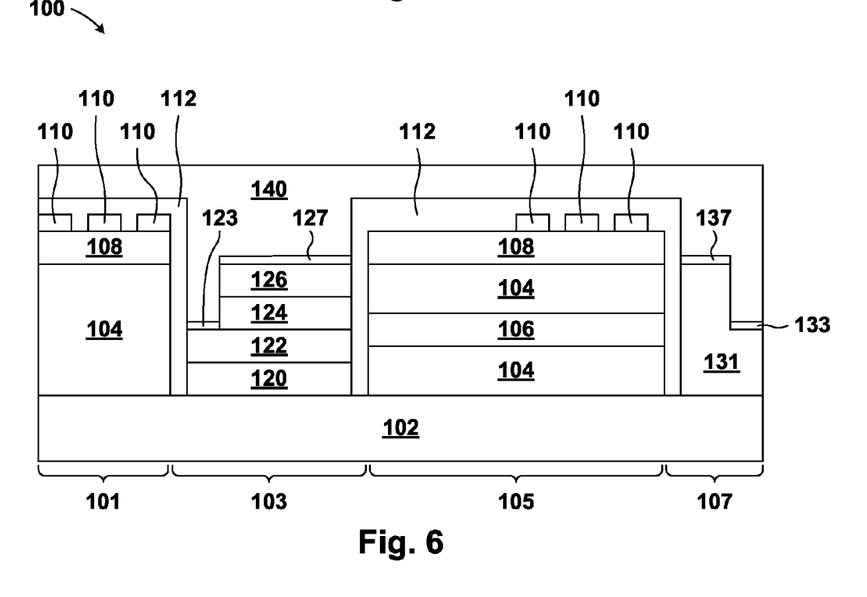
FIG. 6 is a cross section view of the semiconductor structure and illustrates the formation a second insulator layer, according to an exemplary embodiment.

With reference to FIG. 6, a demonstrative illustration of structure 100 is provided during an intermediate step of the method of fabricating a buried optoelectronic device and optical interconnect, according to an embodiment. More specifically, the method may include forming a second insulator layer 140 on the first insulator layer 112, the first top and bottom contact 123, 127, and the second top and bottom contact 133, 137.

The second insulator layer 140 may be formed using any deposition technique known in the art, such as, for example, chemical vapor deposition, plasma enhanced chemical vapor deposition, atomic layer deposition, or physical vapor deposition. The second insulator layer 140 may be any dielectric material known in the art, such as, for example; oxides, nitrides, or oxynitrides.

Figure 7:
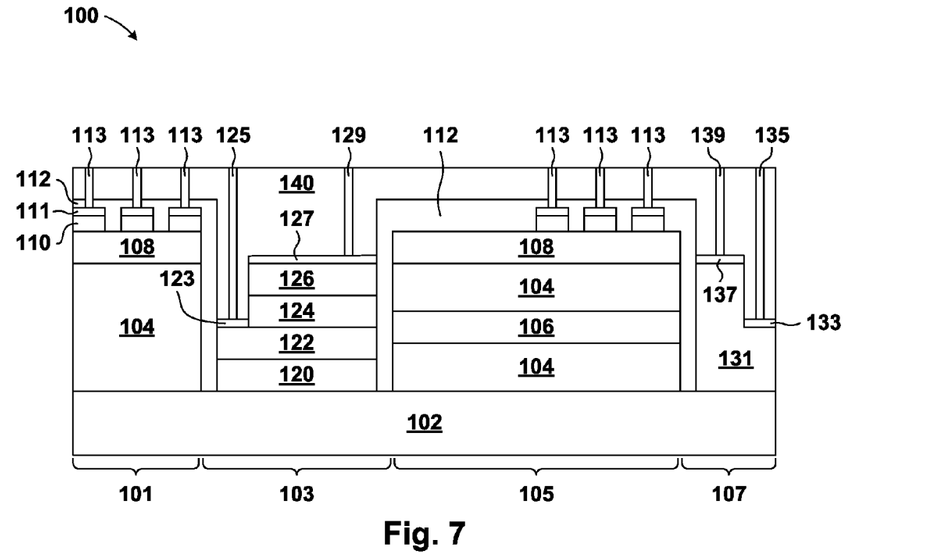
FIG. 7 is a cross section view of the semiconductor structure and illustrates the formation a device interconnect, a first bottom interconnect, a first top interconnect, a second bottom interconnect, and a second top interconnect, according to an exemplary embodiment.

With reference to FIG. 7, a demonstrative illustration of structure 100 is provided during an intermediate step of the method of fabricating a buried optoelectronic device and optical interconnect, according to an embodiment. More specifically, the method may include forming device interconnects 113, a first bottom and top interconnect 125, 129, and a second bottom and top interconnect 135, 139 through the second insulator layer 140.

The device interconnects 113 may be formed by etching a trench through the second insulator layer 140 and the first insulator layer 112 using any etching technique known in the art, such as, for example, reactive ion etching. The trench may expose a top surface of the devices 110. A silicide layer 111 may be formed on the top surface of the devices 110 using any deposition technique known in the art, such as, for example, chemical vapor deposition of a thin metal layer followed by, for example, an alloy annealing process at a temperature of about 400° C. The device interconnects 113 may be formed in the trench, and on the silicide layer 111, using any deposition technique known in the art, such as, for example, chemical vapor deposition, plasma enhanced chemical vapor deposition, atomic layer deposition, or physical vapor deposition. The device interconnects 113 may be any conductive material known in the art such as, for example, copper.

The first bottom interconnect 125 may be formed by etching a trench through the second insulator layer 140 using any etching technique known in the art, such as, for example, reactive ion etching. The trench may expose a top surface of the first bottom contact 123. The first bottom interconnect 125 may be formed in the trench using any deposition technique known in the art, such as, for example, chemical vapor deposition, plasma enhanced chemical vapor deposition, atomic layer deposition, or physical vapor deposition. The first bottom interconnect 125 may be any conductive material known in the art such as, for example, copper.

The first top interconnect 129 may be formed by etching a trench through the second insulator layer 140 using any etching technique known in the art, such as, for example, reactive ion etching. The trench may expose a top surface of the first top contact 127. The first top interconnect 129 may be formed in the trench using any deposition technique known in the art, such as, for example, chemical vapor deposition, plasma enhanced chemical vapor deposition, atomic layer deposition, or physical vapor deposition. The first top interconnect 129 may be any conductive material known in the art such as, for example, copper.

The second bottom interconnect 135 may be formed by etching a trench through the second insulator layer 140 using any etching technique known in the art, such as, for example, reactive ion etching. The trench may expose a top surface of the second bottom contact 133. The second bottom interconnect 135 may be formed in the trench using any deposition technique known in the art, such as, for example, chemical vapor deposition, plasma enhanced chemical vapor deposition, atomic layer deposition, or physical vapor deposition. The second bottom interconnect 135 may be any conductive material known in the art such as, for example, copper.

The second top interconnect 139 may be formed by etching a trench through the second insulator layer 140 using any etching technique known in the art, such as, for example, reactive ion etching. The trench may expose a top surface of the second top contact 137. The second top interconnect 139 may be formed in the trench using any deposition technique known in the art, such as, for example, chemical vapor deposition, plasma enhanced chemical vapor deposition, atomic layer deposition, or physical vapor deposition. The second top interconnect 139 may be any conductive material known in the art such as, for example, copper.

Figure 8:
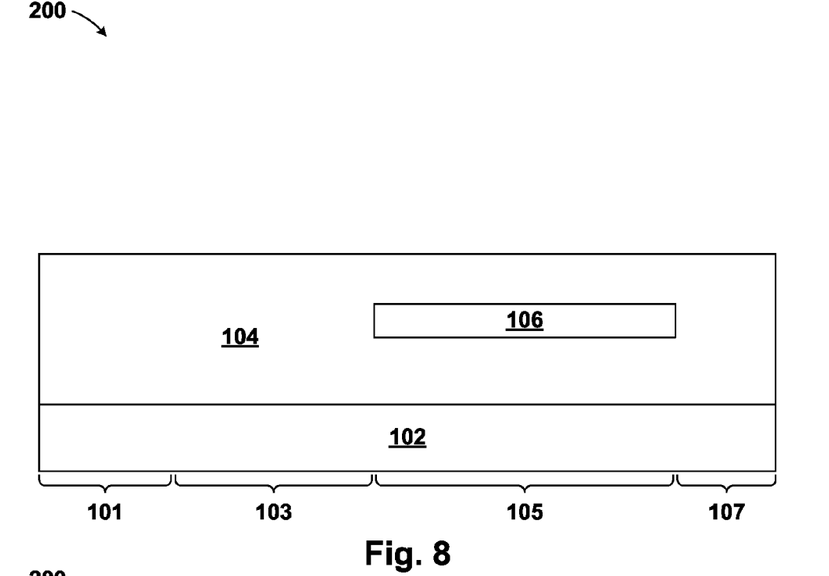
FIG. 8 is a cross section view of an alternative semiconductor structure, according to an exemplary embodiment.

With reference to FIG. 8, a demonstrative illustration of a structure 200 is provided during an intermediate step of the method of fabricating a buried optoelectronic device and optical interconnect, according to an embodiment. More specifically, the method can start by providing the buried waveguide 106 in the BOX layer 104. It should be noted, structure 200 is similar to structure 100 illustrated in FIG. 1; however, structure 200 does not have the top layer of the SOI substrate (i.e., the semiconductor layer 108, described above). In an embodiment, the substrate 102 is a bulk silicon substrate having a (111) crystallographic orientation.

Figure 9:
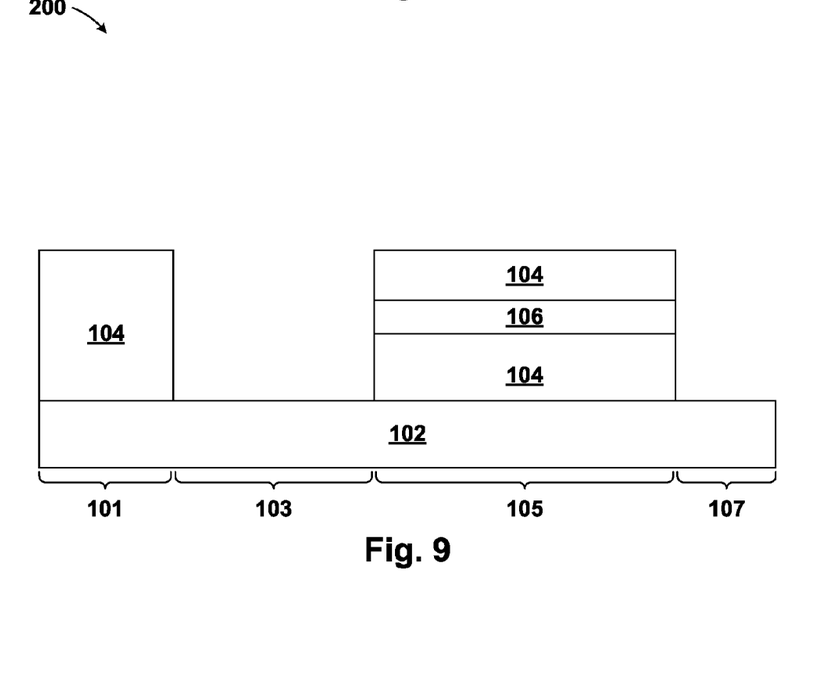
FIG. 9 is a cross section view of the alternative semiconductor structure and illustrates the removal of a BOX layer from a first optoelectronic region and from a second optoelectronic region, according to an exemplary embodiment.

With reference to FIG. 9, a demonstrative illustration of structure 200 is provided during an intermediate step of the method of fabricating a buried optoelectronic device and optical interconnect, according to an embodiment. More specifically, the method may include removing the BOX layer 104 from the first optoelectronic device region 103 and the second optoelectronic device region 107. The BOX layer 104 may be removed using any etching technique known in the art, such as, for example, a reactive ion etching process.

Figure 10:
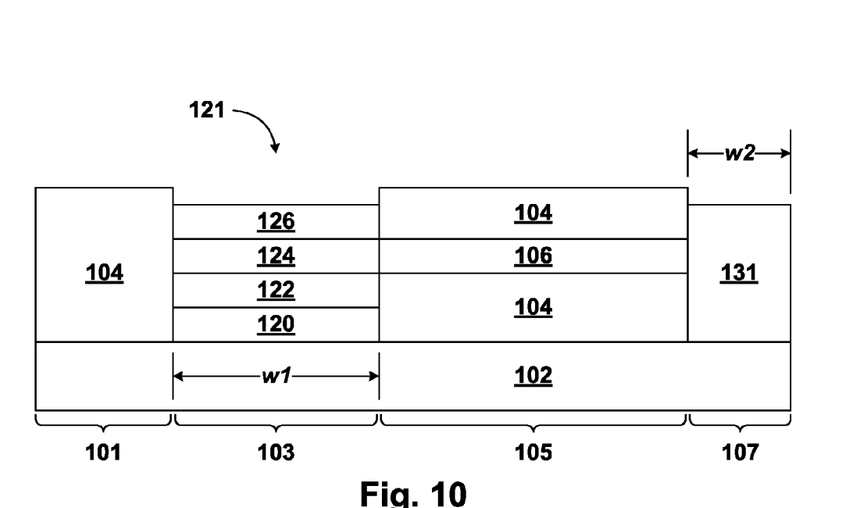
FIG. 10 is a cross section view of the alternative semiconductor structure and illustrates the formation of a first optoelectronic device in the first optoelectronic region and a second optoelectronic device in the second optoelectronic region, according to an exemplary embodiment.

With reference to FIG. 10, a demonstrative illustration of structure 200 is provided during an intermediate step of the method of fabricating a buried optoelectronic device and optical interconnect, according to an embodiment. More specifically, the method may include forming the first optoelectronic device 121 in the first optoelectronic region 103 and the second optoelectronic device 131 in the second optoelectronic device region 107 (described above). In an embodiment, the top cladding layer 126 and the bottom cladding layer 122 are GaN or AlGaN, and the active region 124 is InGaN. The GaN based material may be grown on the substrate 102 before the formation of the device 110 due to a high growth temperature ranging from about 1000-1200° C. Vertical growth in the trench followed by lateral over growth techniques can be used to obtain high quality GaN based material on silicon.

Figure 11:
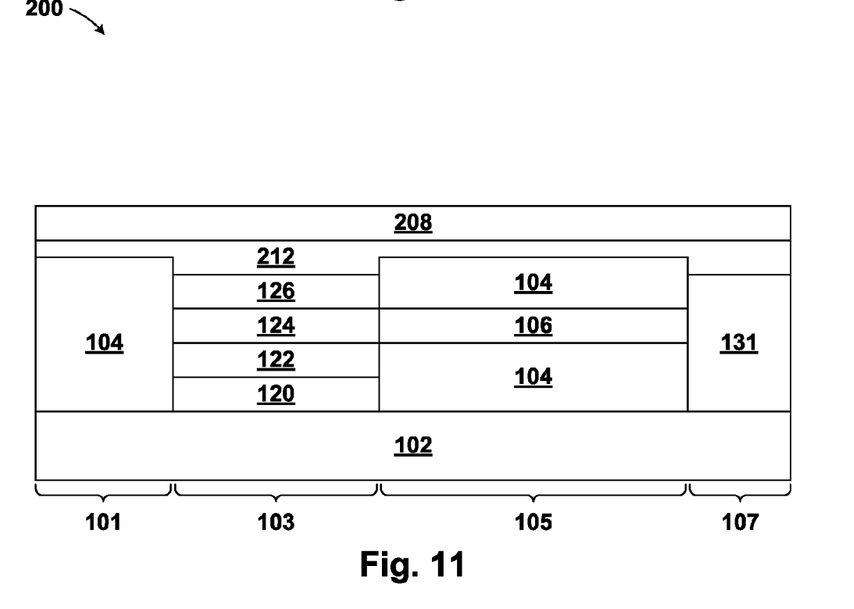
FIG. 11 is a cross section view of the alternative semiconductor structure and illustrates the formation of a first insulator layer and a semiconductor layer on the BOX layer, on the first optoelectronic device, and on the second optoelectronic device, according to an exemplary embodiment.

With reference to FIG. 11, a demonstrative illustration of structure 200 is provided during an intermediate step of the method of fabricating a buried optoelectronic device and optical interconnect, according to an embodiment. More specifically, the method may include forming semiconductor layer 208 and a first insulator layer 212 on the BOX layer 104, the first optoelectronic device 121, and the second optoelectronic device 131.

The first insulator layer 212 may be formed on the BOX layer 104, the first optoelectronic device 121, and the second optoelectronic device 131 using any deposition techniques known in the art, such as, for example; ion implantation, thermal or plasma oxidation or nitridation, chemical vapor deposition, and/or physical vapor deposition. The first insulator layer 212 may be any dielectric material known in the art, such as, for example; oxides, nitrides, or oxynitrides. In an embodiment, the first insulator layer 212 is $SiO_2$.

The semiconductor layer 208 may be formed on the first insulator layer 212 using any deposition technique known in the art, such as, for example, chemical vapor deposition, plasma enhanced chemical vapor deposition, atomic layer deposition, or physical vapor deposition. The semiconductor layer 208 may be any semiconductor material known in the art, such as, for example, Si, Ge, SiGe, SiC, SiGeC, InAs, GaAs, InP or other semiconductors. The semiconductor layer 208 may have any crystallographic orientation, such as, for example, (100) or (111). The crystallographic orientation may depend on the orientation of the substrate 102. In an embodiment, the semiconductor layer 208 is silicon having a (111) crystallographic orientation.

Figure 12:
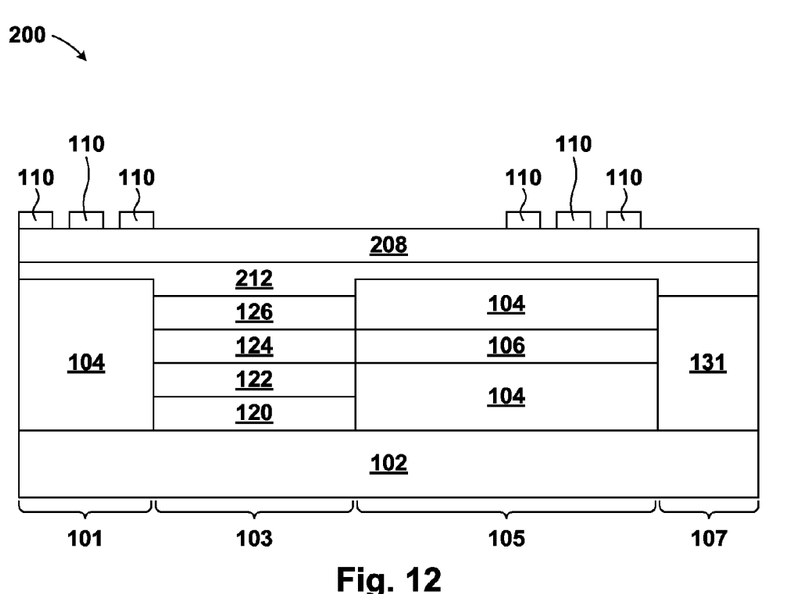
FIG. 12 is a cross section view of the alternative semiconductor structure and illustrates the formation of a device on the semiconductor layer in a first device region and in a second device region, according to an exemplary embodiment.

With reference to FIG. 12, a demonstrative illustration of structure 200 is provided during an intermediate step of the method of fabricating a buried optoelectronic device and optical interconnect, according to an embodiment. More specifically, the method may include forming the devices 110 on the semiconductor layer 208. It should be noted, the devices 110 may be formed on the semiconductor layer 208 using the same process as described in reference to FIG. 2.

Figure 13:
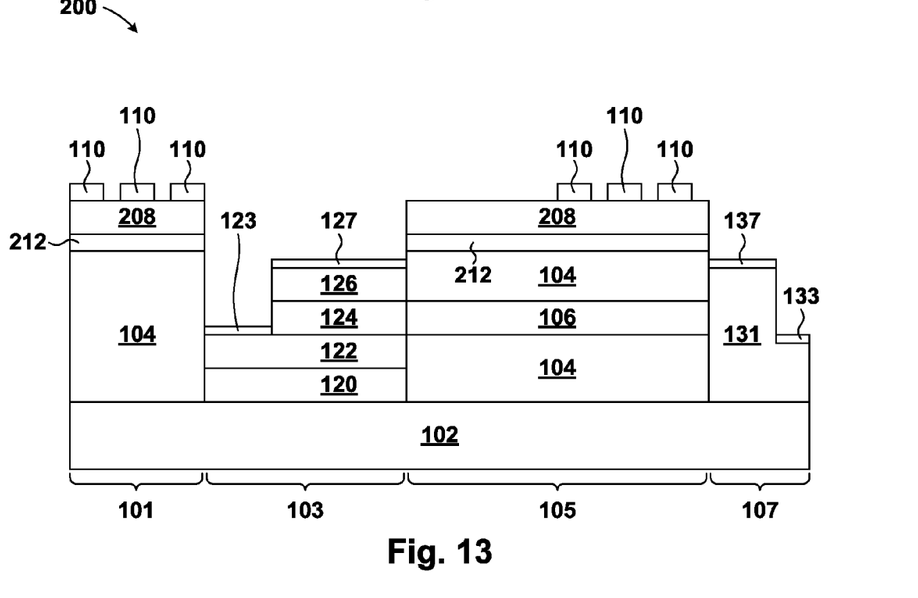
FIG. 13 is a cross section view of the alternative semiconductor structure and illustrates the formation of a first bottom contact and first top contact in the first optoelectronic region, and a second bottom contact and a second top contact in the second optoelectronic region, according to an exemplary embodiment.

With reference to FIG. 13, a demonstrative illustration of structure 200 is provided during an intermediate step of the method of fabricating a buried optoelectronic device and optical interconnect, according to an embodiment. More specifically, the method may include; forming the first bottom contact 123 on the top surface of the bottom cladding layer 122, the first top contact 127 on the top surface of the top cladding layer 126, and the second bottom and top contacts 133, 137 on the second optoelectronic device 131.

The semiconductor layer 208 and the first insulator layer 212 may be removed from the first and second optoelectronic regions 103, 107 using any etching technique known in the art, such as, for example, a reactive ion etching process. The first bottom and top contacts 123, 127 and the second bottom and top contacts 133, 137 may be formed in the first and second optoelectronic devices 121, 131 as described above.

Figure 14:
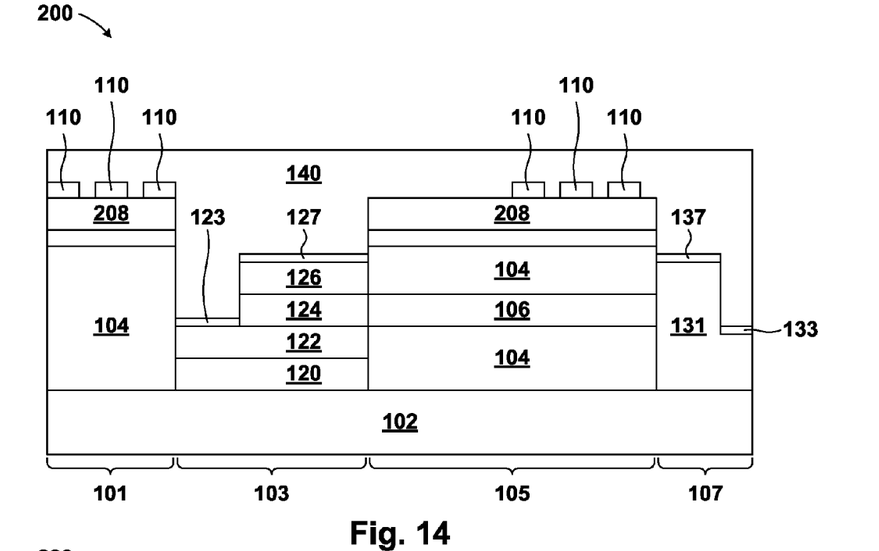
FIG. 14 is a cross section view of the alternative semiconductor structure and illustrates the formation a second insulator layer, according to an exemplary embodiment.

With reference to FIG. 14, a demonstrative illustration of structure 200 is provided during an intermediate step of the method of fabricating a buried optoelectronic device and optical interconnect, according to an embodiment. More specifically, the method may include forming the second insulator layer 140 on the first insulator layer 212, the first top and bottom contacts 123, 127, and the second top and bottom contacts 133, 137. The formation of the second insulator layer 140 may be similar to the formation process described in reference to FIG. 6.

Figure 15:
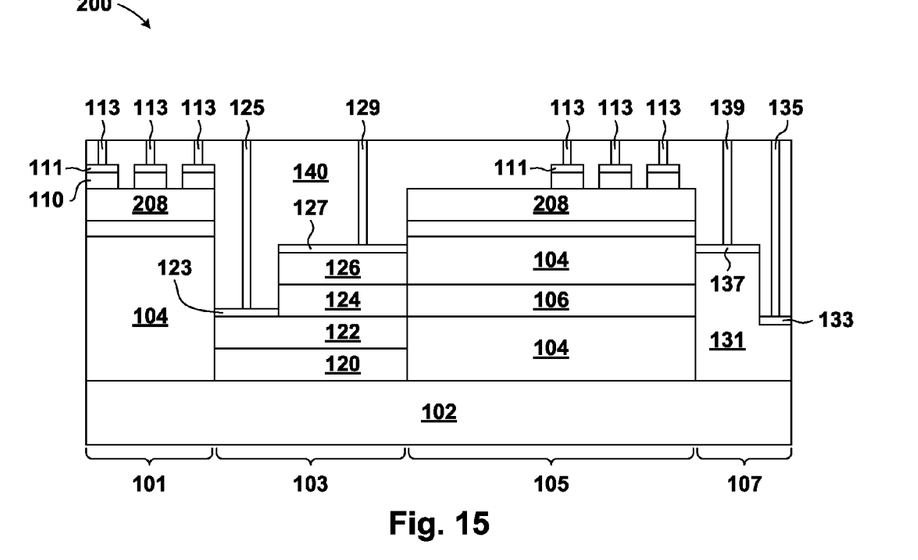
FIG. 15 is a cross section view of the alternative semiconductor structure and illustrates the formation a device interconnect, a first bottom interconnect, a first top interconnect, a second bottom interconnect, and a second top interconnect, according to an exemplary embodiment.

With reference to FIG. 15, a demonstrative illustration of structure 200 is provided during an intermediate step of the method of fabricating a buried optoelectronic device and optical interconnect, according to an embodiment. More specifically, the method may include forming the device interconnects 113, the first bottom and top interconnect 125, 129, and the second bottom and top interconnects 135, 139 through the second insulator layer 140. It should be noted, this process may be the same as described in reference to FIG. 7.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a buried waveguide in a semiconductor-on-insulator (SOI) substrate, the SOI substrate has a first device region, a first optoelectronic region, a second device region, and a second optoelectronic region, the SOI substrate includes a semiconductor layer on a buried oxide (BOX) layer, the BOX layer is on a substrate, wherein the buried waveguide is in the BOX layer and the buried waveguide is in the second device region;
    forming a device on the semiconductor layer in the first device region and in the second device region;
    removing the BOX layer and the semiconductor layer from the first optoelectronic region and the second optoelectronic region;
    forming a first insulator layer on the device, on the semiconductor layer, on the substrate, and on sidewalls of the BOX layer and buried waveguide;
    forming a first optoelectronic device on the substrate in the first optoelectronic region and a second optoelectronic device on the substrate in the second optoelectronic region, the first optoelectronic device includes a top cladding layer, an active region, and a bottom cladding layer, wherein the top cladding layer is on the active region, the active region is on the bottom cladding layer, the bottom cladding layer is on a buffer layer, and the buffer layer is on the substrate;

forming a first bottom contact on a top surface of the bottom cladding layer, a first top contact on a top surface of the top cladding layer, a second bottom contact on a bottom portion of the second optoelectronic device, and a second top contact on a top portion of the second optoelectronic device;

forming a second insulator layer on the first insulator layer, on the first bottom contact, on the first top contact, on the second bottom contact, and on the second top contact; and forming a device interconnect, a first bottom interconnect, a first top interconnect, a second bottom interconnect, and a second top interconnect through the second insulator layer, wherein the device interconnect is in electrical connection with the device, the first bottom interconnect is in electrical connection with the first bottom contact, the first top interconnect is in electrical connection with the first top contact, the second bottom interconnect is in electrical connection with the second bottom contact, and the second top interconnect is in electrical connection with the second top contact.

2. The method of claim 1, wherein the first optoelectronic device is a III-V semiconductor laser and the second optoelectronic device is a III-V semiconductor detector.

3. The method of claim 1, wherein the second optoelectronic device is a modulator.

4. The method of claim 1, wherein the active region is adjacent to the buried waveguide.

5. The method of claim 1, wherein the first optoelectronic device and the second optoelectronic device are below a device level.

6. The method of claim 1, wherein the device includes a silicon complementary metal-oxide-semiconductor (CMOS) device.

7. The method of claim 1, wherein the substrate is silicon having a (100) crystallographic orientation and the semiconductor layer is silicon having a (100) crystallographic orientation.

8. A method comprising:
  forming a buried waveguide in a buried oxide (BOX) layer, the BOX layer is in a first device region, a first optoelectronic region, a second device region and a second optoelectronic region, the buried waveguide is in the second device region, and the BOX layer is on a substrate;
  removing the BOX layer from the first optoelectronic region and the second optoelectronic region, a top surface of the substrate is exposed in the first optoelectronic region and in the second optoelectronic region;
  forming a first optoelectronic device on the exposed top surface of the substrate in the first optoelectronic region and a second optoelectronic device on the exposed top surface of the substrate in the second optoelectronic region, the first optoelectronic device includes a top cladding layer, an active region, and a bottom cladding layer, wherein the top cladding layer is on the active region, the active region is on the bottom cladding layer, the bottom cladding layer is on a buffer layer, and the buffer layer is on the substrate;
  forming a first insulator layer on the BOX layer, on the first optoelectronic device, and on the second optoelectronic device;
  forming a semiconductor layer on the first insulator layer;
  forming a device on the semiconductor layer in the first device region and in the second device region;
  forming a first bottom contact on a top surface of the bottom cladding layer, a first top contact on a top surface of the top cladding layer, a second bottom contact on a bottom portion of the second optoelectronic device, and a second top contact on a top portion of the second optoelectronic device;
  forming a second insulator layer on the device, on the semiconductor layer, on the first bottom contact, on the first top contact, on the second bottom contact, and on the second top contact; and
  forming a device interconnect, a first bottom interconnect, a first top interconnect, a second bottom interconnect, and a second top interconnect through the second insulator layer, wherein the device interconnect is in electrical connection with the device, the first bottom interconnect is in electrical connection with the first bottom contact, the first top interconnect is in electrical connection with the first top contact, the second bottom interconnect is in electrical connection with the second bottom contact, and the second top interconnect is in electrical connection with the second top contact.

9. The method of claim 8, wherein the first optoelectronic device is a III-V semiconductor laser and the second optoelectronic device is a III-V semiconductor detector.

10. The method of claim 8, wherein the second optoelectronic device is a modulator.

11. The method of claim 8, wherein the active region is adjacent to the buried waveguide.

12. The method of claim 8, further comprising:
  forming a silicide between the device and the device interconnect.

13. The method of claim 8, wherein the device includes a silicon complementary metal-oxide-semiconductor (CMOS) device.

14. The method of claim 8, wherein the substrate is silicon having a (100) crystallographic orientation and the semiconductor layer is silicon having a (100) crystallographic orientation.

15. A structure comprising:
  a buried waveguide in a buried oxide (BOX) layer, the BOX layer is on a substrate in a first device region and in a second device region, the substrate is in the first device region, a first optoelectronic region, the second device region, and a second optoelectronic region;
  a semiconductor layer above the BOX layer in the first device region and in the second device region;
  a first optoelectronic device on the substrate in the first optoelectronic region and a second optoelectronic device on the substrate in the second optoelectronic region, the first optoelectronic device includes a top cladding layer, an active region, and a bottom cladding layer, wherein the top cladding layer is on the active region, the active region is on the bottom cladding layer, the bottom cladding layer is on a buffer layer, and the buffer layer is on the substrate;
  a device on the semiconductor layer in the first device region and in the second device region;
  a first bottom contact on a top surface of the bottom cladding layer, a first top contact on a top surface of the top cladding layer, a second bottom contact on a bottom portion of the second optoelectronic device, and a second top contact on a top portion of the second optoelectronic device;

a second insulator layer above the device, above the first optoelectronic device, and above the second optoelectronic device;

a device interconnect in electrical connection with the device, a first bottom interconnect in electrical connection with the first bottom contact, a first top interconnect in electrical connection with the first top contact, a second bottom interconnect in electrical connection with the second bottom contact, and a second top interconnect in electrical connection with the second top contact.

16. The structure of claim 15, wherein the first optoelectronic device is a III-V semiconductor laser and the second optoelectronic device is a III-V semiconductor detector.

17. The structure of claim 15, wherein the second optoelectronic device is a modulator.

18. The structure of claim 15, wherein the active region is adjacent to the buried waveguide.

19. The structure of claim 15, wherein the device includes a silicon complementary metal-oxide-semiconductor (CMOS) device.

20. The structure of claim 15, wherein the substrate is silicon having a (100) crystallographic orientation and the semiconductor layer is silicon having a (100) crystallographic orientation.

* * * * *